(12) United States Patent
Nakamura et al.

(10) Patent No.: US 8,279,576 B2
(45) Date of Patent: Oct. 2, 2012

(54) ELECTROSTATIC CHUCK

(75) Inventors: Keiichi Nakamura, Handa (JP);
Shunsuke Tanaka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 61 days.

(21) Appl. No.: 12/753,992

(22) Filed: Apr. 5, 2010

(65) Prior Publication Data

US 2010/0254065 A1 Oct. 7, 2010

Related U.S. Application Data

(60) Provisional application No. 61/167,265, filed on Apr. 7, 2009.

(51) Int. Cl.
*H01L 21/683* (2006.01)
*H01T 23/00* (2006.01)
*B32B 9/00* (2006.01)
*C04B 35/00* (2006.01)
*B23B 31/28* (2006.01)

(52) U.S. Cl. ....... 361/234; 428/408; 428/698; 501/98.4; 279/128

(58) Field of Classification Search .................... 361/234
See application file for complete search history.

(56) References Cited

U.S. PATENT DOCUMENTS

| 7,042,697 | B2 | 5/2006 | Tsuruta et al. | |
|---|---|---|---|---|
| 7,803,733 | B2 * | 9/2010 | Teratani et al. | 501/98.4 |
| 2002/0012219 | A1 | 1/2002 | Tsuruta et al. | |
| 2007/0215840 | A1 * | 9/2007 | Yoshikawa et al. | 252/500 |

FOREIGN PATENT DOCUMENTS

| JP | 2002-050676 A1 | 2/2002 |
|---|---|---|
| JP | 2005-294648 A1 | 10/2005 |

* cited by examiner

*Primary Examiner* — Jared Fureman
*Assistant Examiner* — Lucy Thomas
(74) *Attorney, Agent, or Firm* — Burr & Brown

(57) ABSTRACT

A ceramic electrostatic chuck according to the present invention includes a dielectric layer with a support layer in contact with the back side of the dielectric layer, and an embedded electrostatic electrode. A wafer is placed on the dielectric layer and the dielectric layer is formed of sintered aluminum nitride containing Sm and has a volume resistivity in the range of $4 \times 10^9$ to $4 \times 10^{10}$ Ωcm at room temperature. The support layer is formed of sintered aluminum nitride containing Sm and Ce and has a volume resistivity of $1 \times 10^{13}$ Ωcm or more at room temperature.

3 Claims, 2 Drawing Sheets (a) Example 1

(b) Comparative Example 1

ELECTROSTATIC CHUCK

FIELD OF THE INVENTION

The present invention relates to an electrostatic chuck.

BACKGROUND OF THE INVENTION

There are ceramic electrostatic chucks for use in semiconductor manufacturing apparatuses. Ceramic electrostatic chucks include a metal electrode embedded in a ceramic body. One ceramic portion on the wafer side of the electrode is referred to as a dielectric layer. Another ceramic portion on the opposite side of the electrode is referred to as a support layer. Electrostatic chucks that include a dielectric layer having a volume resistivity in the range of approximately $10^8$ to $10^{13}$ Ωcm are known as Johnsen-Rahbek-type electrostatic chucks.

The present applicant found that a support layer having a higher volume resistivity than a dielectric layer allows an electrostatic chuck to have stable attractive force even when the electrostatic chuck is joined to a lower electroconductive radio-frequency electrode (see Patent Document 1). The present applicant also devised a ceramic material that has a volume resistivity that is effective at generating Johnsen-Rahbek attractive force by adding Sm to the main component aluminum nitride (see Patent Document 2).

PRIOR ART DOCUMENTS

Patent Documents

Patent Document 1 Japanese Unexamined Patent Application Publication No. 2002-50676
Patent Document 2 Japanese Unexamined Patent Application Publication No. 2005-294648

SUMMARY OF THE INVENTION

As a combination of Patent Documents 1 and 2, an electrostatic chuck that includes a dielectric layer formed of aluminum nitride containing Sm and a support layer formed of aluminum nitride having a purity of 99.9% has a high attractive force, but disadvantageously there is a long time from the termination of the application of a high voltage to an electrode to the detachment of an adsorbed wafer (detachment time). A long detachment time causes a dead time after the treatment of a wafer, resulting in a low processing speed for the wafer. A support layer having a small thickness suffers from warping during a manufacturing process and requires a corrective process to maintain flatness. Furthermore, the electrostatic chuck subjected to temperature cycling between a high temperature and a low temperature caused a deterioration in the bonding strength of a thin dielectric layer after long-term use. When the electrostatic chuck is exposed to atmospheric pressure at the undersurface thereof and a vacuum at the top surface thereof, a deterioration in the mechanical strength of the electrostatic chuck may result in damage to the dielectric layer.

The present invention has been accomplished to solve these problems. Accordingly, it is an object of the present invention to provide an electrostatic chuck that has a high attractive force and a short detachment time, less frequently suffers from warping during manufacture, and undergoes a reduced deterioration in mechanical strength after a heat cycle.

An electrostatic chuck according to the present invention is a ceramic electrostatic chuck that includes an embedded electrode, the electrostatic chuck including:

a dielectric layer on which a wafer can be placed, the dielectric layer being formed of sintered aluminum nitride containing Sm and having a volume resistivity in the range of $4 \times 10^9$ to $4 \times 10^{10}$ Ωcm at room temperature and a support layer that is in contact with the back side of the dielectric layer, is formed of sintered aluminum nitride containing Sm and Ce, and has a volume resistivity of $1 \times 10^{13}$ Ωcm or more at room temperature.

This electrostatic chuck has a large wafer attractive force when a high voltage is applied to the electrode while a wafer is placed on the electrostatic chuck. The electrostatic chuck less frequently suffers from warping during manufacture, has a short elapsed time from the termination of the application of a high voltage to the electrode to the detachment of the wafer (detachment time), and undergoes a reduced deterioration in mechanical strength after a heat cycle.

In an electrostatic chuck according to the present invention, preferably, the dielectric layer is formed of sintered aluminum nitride that contains an Al—Sm—O compound, Sm being contained in an amount 1.2 to 4% by weight in terms of $Sm_2O_3$, the $Al_2O_3/Sm_2O_3$ equivalent weight ratio of Al in terms of $Al_2O_3$ to Sm in terms of $Sm_2O_3$ being in the range of 0.8 to 1.5, and the support layer is formed of sintered aluminum nitride that contains oxides of Sm and Ce, Sm being contained in an amount 0.96% to 2.2% by weight in terms of $Sm_2O_3$, Ce being contained in an amount 0.2% to 0.5 by weight in terms of $CeO_2$. This can ensure the advantages of the present invention, that is, a large attractive force, a short detachment time, and a small strength reduction after a heat cycle.

In an electrostatic chuck according to the present invention, preferably, the electrode is formed of molybdenum metal or a molybdenum alloy and is disposed within the dielectric layer, within the support layer, or at an interface between the dielectric layer and the support layer. As described in Patent Document 1 (Japanese Unexamined Patent Application Publication No. 2002-50676), an electrode formed of molybdenum metal or a molybdenum alloy tends to have a high-resistance region around the electrode and a reduced attractive force. Thus, the application of the present invention has a great significance.

In an electrostatic chuck according to the present invention, the support layer may include a heating resistor (heater). Since the support layer has a high volume resistivity, the heating resistor embedded in the support layer allows efficient contact conduction heating while a wafer is adsorbed on the electrostatic chuck.

DETAILED DESCRIPTION OF THE INVENTION

General Manufacturing Procedures

Figure 1:
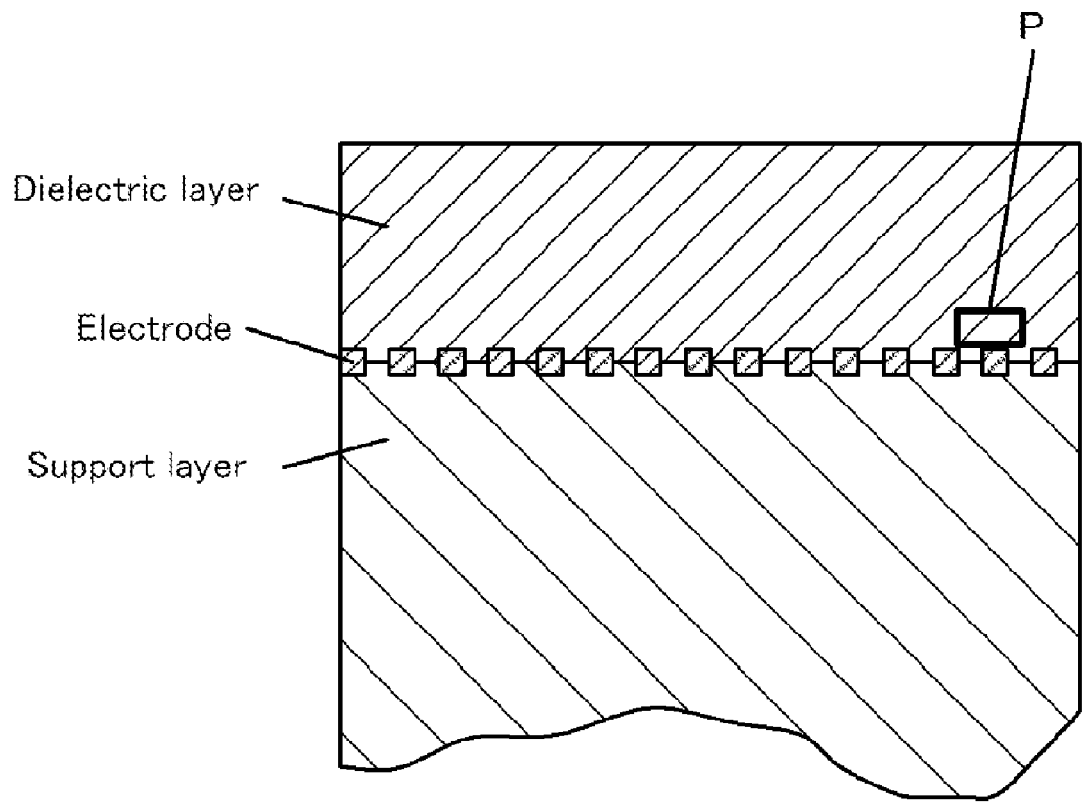
FIG. 1 is an explanatory drawing of a portion for which SEM photographs shown in FIG. 2 were taken.

Sintered aluminum nitride for use as a support layer was prepared. The sintered aluminum nitride was produced by shaping an aluminum nitride powder containing $Sm_2O_3$ and $CeO_2$ and firing the powder by hot pressing. The hot pressing load was 50 kg/cm², the firing temperature ranged from 1800°

C. to 2100° C., and the firing time was four hours or less. The top surface of the support layer was then ground flat. An electrostatic electrode formed of a metal mesh was placed on the flat surface. A raw material powder for a dielectric layer was then pressed on top of the electrostatic electrode to form a compact including the support layer. The raw material powder was an aluminum nitride powder containing $Sm_2O_3$ and $Al_2O_3$. The compact was fired by hot pressing to produce an electrostatic chuck. The hot pressing load was 70 kg/cm², the firing temperature ranged from 1800° C. to 2100° C., and the firing time was four hours or less.

emission spectrometry. Oxygen was measured by an inert gas fusion-infrared absorption method. $Sm_2O_3$ and $CeO_2$ equivalent amounts were calculated from the measurements of Sm and Ce. The amounts of oxygen in $Sm_2O_3$ and $CeO_2$ were calculated from the $Sm_2O_3$ and $CeO_2$ equivalent amounts. On the basis of the difference between these amounts of oxygen and the actually measured amount of oxygen, the amount of $Al_2O_3$ was calculated.

TABLE 1

|  |  | Compositions (wt %) | | | | Weight Ratio |
|  |  | $Sm_2O_3$ | $CeO_2$ | $Al_2O_3$ | AlN | $Al_2O_3/Sm_2O_3$ |
| --- | --- | --- | --- | --- | --- | --- |
| Example 1 | Support Layer | 1.6 | 0.32 | 0 | Residual Amount | — |
|  | Dielectric Layer | 2.4 | 0 | 2.4 | Residual Amount | 1.0 |
| Example 2 | Support Layer | 0.96 | 0.23 | 0 | Residual Amount | — |
|  | Dielectric Layer | 2.4 | 0 | 2.4 | Residual Amount | 1.0 |
| Example 3 | Support Layer | 2.1 | 0.4 | 0 | Residual Amount | — |
|  | Dielectric Layer | 2.4 | 0 | 2.4 | Residual Amount | 1.0 |
| Example 4 | Support Layer | 1.6 | 0.32 | 0 | Residual Amount | — |
|  | Dielectric Layer | 1.2 | 0 | 1 | Residual Amount | 0.8 |
| Example 5 | Support Layer | 1.6 | 0.32 | 0 | Residual Amount | — |
|  | Dielectric Layer | 4 | 0 | 3.2 | Residual Amount | 0.8 |
| Example 6 | Support Layer | 2.2 | 0.5 | 0 | Residual Amount | — |
|  | Dielectric Layer | 2.4 | 0 | 3.6 | Residual Amount | 1.5 |
| Example 7 | Support Layer | 0.96 | 0.2 | 0 | Residual Amount | — |
|  | Dielectric Layer | 1.2 | 0 | 0.96 | Residual Amount | 0.8 |
| Example 8 | Support Layer | 0.96 | 0.2 | 0 | Residual Amount | — |
|  | Dielectric Layer | 4 | 0 | 6 | Residual Amount | 1.5 |
| Comparative Example 1 | Support Layer | 0 | 0 | 0 | Residual Amount | — |
|  | Dielectric Layer | 2.4 | 0 | 2.4 | Residual Amount | 1.0 |
| Comparative Example 2 | Support Layer | 0.8 | 0.2 | 0 | Residual Amount | — |
|  | Dielectric Layer | 2.4 | 0 | 2.4 | Residual Amount | 1.0 |
| Comparative Example 3 | Support Layer | 2.5 | 0.6 | 0 | Residual Amount | — |
|  | Dielectric Layer | 2.4 | 0 | 2.4 | Residual Amount | 1.0 |
| Comparative Example 4 | Support Layer | 0.8 | 0.2 | 0 | Residual Amount | — |
|  | Dielectric Layer | 1 | 0 | 0.8 | Residual Amount | 0.8 |
| Comparative Example 5 | Support Layer | 2.5 | 0.6 | 0 | Residual Amount | — |
|  | Dielectric Layer | 5 | 0 | 7 | Residual Amount | 1.4 |

Examples 1 to 8 and Comparative Examples 1 to 5

Electrostatic chucks according to Examples 1 to 8 and Comparative Examples 1 to 5 were produced in accordance with the General Manufacturing Procedures described above such that the electrostatic chucks had the compositions shown in the following Table 1. Each of the electrostatic chucks had a diameter of 298 mm. The support layer had a thickness of 3 mm, and the dielectric layer had a thickness of 1.0 mm. Each of the electrostatic chucks included a bipolar electrostatic electrode (the electrode material was a Mo mesh). Circular projections each having a diameter of 1 mm and a height of 8 µm were formed almost uniformly on the wafer-mounting face of the dielectric layer. A ring projection having a width of 1 mm and a height of 8 µm was formed along the periphery of the wafer-mounting face. A gas hole having a diameter of 1 mm for introducing a gas was bored through the wafer-mounting face. A countersunk hole reaching the electrostatic electrode was bored in the support layer, and a power supply terminal was brazed to the electrostatic electrode. The ceramic electrostatic chuck was then joined to an Al cooling plate also serving as a lower RF electrode) with an adhesive. The compositions shown in Table 1 were determined in the following manner. For Sm and Ce, a solution of sintered AlN was subjected to inductively coupled plasma (ICP) atomic The electrostatic chucks thus produced were evaluated in the following manner. Table 2 shows the evaluation results.

Evaluation Methods

Method for Measuring Attractive Force:

A Si cylinder (Si probe) having a diameter of 2 cm was placed on a wafer-mounting face of an electrostatic chuck. After a voltage of 200 V was applied to an electrostatic electrode, the Si probe was vertically raised with a tensile load measuring instrument. The load at which the Si probe was detached from the electrostatic chuck was measured to determine the attractive force.

Method for Measuring Detachment Time:

An electrostatic chuck was placed in a vacuum vessel. A voltage of +/−300 V was applied to an electrostatic electrode to adsorb a Si wafer on the electrostatic chuck at a pressure of 10 Pa or less. After one minute, He gas was introduced to the back side of the wafer (a space between the surface of the electrostatic chuck and the wafer) at a pressure of 600 Pa. After the applied voltage was decreased to zero, the time that elapsed before the He gas pressure on the back side decreased drastically was measured as the detachment time. The detachment of the wafer from the electrostatic chuck allows the back side gas to be released to the vacuum vessel, decreasing the He gas pressure drastically. This indicates the time that elapsed before the attractive force of the electrostatic chuck decreases sufficiently.

Method for Measuring Warping

A fired product was roughly processed into a thickness of approximately 8 mm. The thickness of the support layer side was 6 mm, and the thickness of the dielectric layer side was 2 mm. While the support layer side was attached to a flat jig, the dielectric layer side was ground by 1 mm to a total thickness of 7 mm. While the dielectric layer side was then attached to a flat jig, the support layer side was ground by 2 mm to a total thickness of 5 mm. After the fired product was ground by 3 mm in total, the fired product was removed from the flat jig. The fired product was warped because of residual internal stress. The warping was measured with a three-dimensional measuring apparatus.

Method for Measuring Strength After Heat Cycle

In the same way as a method for producing an electrostatic chuck described above, a fired product having a thickness of 5 mm on the support layer side and 5 mm on the dielectric layer side was produced. The fired product was subjected to 5000 cycles of heating and cooling between 300° C. and room temperature (approximately 25° C.) in the air in a heat cycle tester. After that, ten 5-mm square specimens having a thickness of 10 mm were cut. The support layer side and the dielectric layer side were inserted into steel jigs each having a 5-mm square hollow 5 mm in depth. The shear strength was determined from the load at which the specimen was broken under the load in the shear direction of an electrode-bonded interface.

As is clear from Table 2, the electrostatic chucks according to Examples 1 to 8 had a short detachment time, less frequently suffered from warping, and had a high strength even after the long-term heat cycle.

TABLE 2

| | Attractive Force (Pa) | Detachment Time (S) | Warping (mm) | Strength after Heating Cycle (MPa) |
|---|---|---|---|---|
| Example 1 | 4200 | 1 | 0.01 | 260 |
| Example 2 | 4200 | 1 | 0.01 | 280 |
| Example 3 | 4200 | 1 | 0.01 | 270 |
| Example 4 | 4100 | 1 | 0.01 | 260 |
| Example 5 | 4300 | 1 | 0.01 | 250 |
| Example 6 | 4200 | 1 | 0.01 | 260 |
| Example 7 | 4100 | 1 | 0.01 | 250 |
| Example 8 | 4300 | 1 | 0.01 | 270 |
| Comparative Example 1 | 4100 | 8 | 0.07 | 80 |
| Comparative Example 2 | 4100 | 3 | 0.01 | 260 |
| Comparative Example 3 | 4200 | 3 | 0.01 | 270 |
| Comparative Example 4 | 1300 | 6 | 0.01 | 250 |
| Comparative Example 5 | 4400 | 4 | 0.01 | 240 |

In each of the electrostatic chucks, a plane electrode formed of an electroconductive rubber sheet was then placed on the dielectric layer side. A voltage was applied between the plane electrode and the electrostatic electrode to measure the volume resistivity of the dielectric layer. A similar plane electrode was placed on the support layer side. A voltage was applied between the plane electrode and the electrostatic electrode to measure the volume resistivity of the support layer. Table 3 shows the results. All the dielectric layers of the electrostatic chucks according to Examples 1 to 8 had such volume resistivities that the Johnsen-Rahbek force can be generated ($4\times10^9$ to $4\times10^{10}$ Ωcm). The support layers of the electrostatic chucks according to Examples 1 to 8 had higher insulating properties than the dielectric layers ($2\times10^{13}$ Ωcm). In contrast, in the electrostatic chucks according to Comparative Examples 1 to 5, the dielectric layers had too high or low volume resistivities to generate the Johnsen-Rahbek force, and some of the support layers had insufficient insulating properties.

The leakage-currents of the electrostatic chucks were also measured. The leakage-currents were measured in the following manner. First, a silicon wafer was placed on an electrostatic chuck. The silicon wafer was electrically grounded to form a circuit between the silicon wafer and an electrostatic electrode. When a direct-current voltage of 300 V was applied to the electrostatic electrode to adsorb the silicon wafer on the surface of a dielectric layer, the leakage-current flowing from the electrostatic electrode to the silicon wafer was measured. Table 3 shows the results. An excessively large leakage-current may not only cause a short circuit of the apparatus but also damage a device mounted on the silicon wafer. Thus, the leakage-current needs to be 1000 μA or less. All the electrostatic chucks according to Examples had a leakage-current of 1000 μA or less, more specifically 150 μA or less, and do not cause an electric leakage or damage to a device.

TABLE 3

| | Volume Resistivity of the Dielectric layer (Ωcm) | Volume Resistivity of the Support layer (Ωcm) | Leakage Current (μA) |
|---|---|---|---|
| Example 1 | $2 \times 10^{10}$ | $2 \times 10^{13}$ | 120 |
| Example 2 | $3 \times 10^{10}$ | $2 \times 10^{13}$ | 100 |
| Example 3 | $1 \times 10^{10}$ | $2 \times 10^{13}$ | 140 |
| Example 4 | $2 \times 10^{10}$ | $2 \times 10^{13}$ | 150 |
| Example 5 | $2 \times 10^{10}$ | $2 \times 10^{13}$ | 130 |
| Example 6 | $2 \times 10^{10}$ | $2 \times 10^{13}$ | 100 |
| Example 7 | $4 \times 10^{10}$ | $2 \times 10^{13}$ | 120 |
| Example 8 | $4 \times 10^{9}$ | $2 \times 10^{13}$ | 140 |
| Comparative Example 1 | $6 \times 10^{10}$ | $1 \times 10^{11}$ | 110 |
| Comparative Example 2 | $2 \times 10^{10}$ | $2 \times 10^{13}$ | 120 |
| Comparative Example 3 | $2 \times 10^{10}$ | $1 \times 10^{12}$ | 140 |
| Comparative Example 4 | $2 \times 10^{11}$ | $2 \times 10^{13}$ | 20 |
| Comparative Example 5 | $8 \times 10^{8}$ | $1 \times 10^{12}$ | 2400 |

Figure 2:
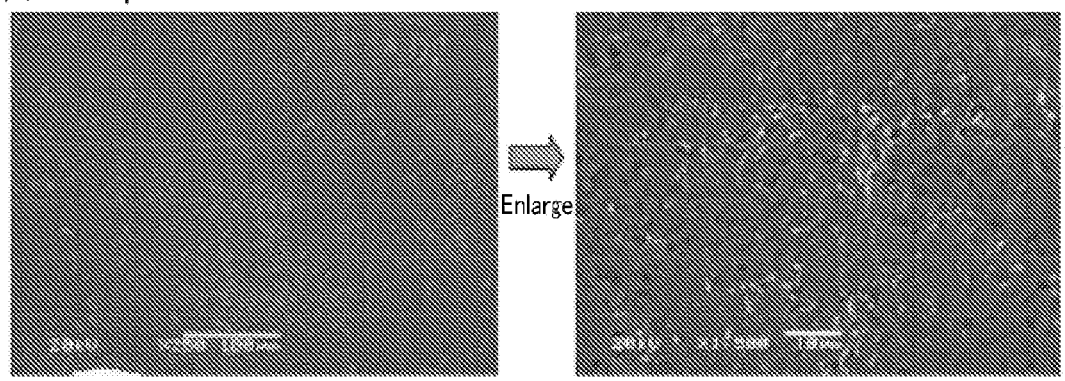
FIG. 2 shows SEM photographs of microstructures for Example 1 and Comparative Example 1.
Figure 2:
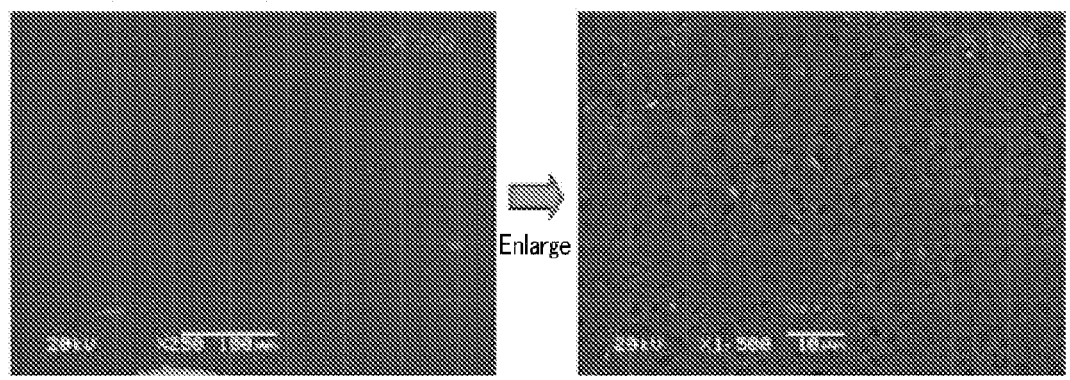

The reasons for such differences between the electrostatic chucks according to Examples and the electrostatic chucks according to Comparative Examples are discussed below by observing the microstructures of the dielectric layers according to Example 1 and Comparative Example 1 (see FIGS. 1 and 2). FIG. 2 shows the microstructures of a portion P in FIG. 1 at two magnifications (250 and 1500 times). In FIG. 2, white areas are rich in Sm. FIG. 2 shows that a grain boundary phase containing Sm (Sm—Al—O phase) in the dielectric layer adjacent to the electrode was less in Comparative Example 1 than in Example 1, indicating that Sm diffused from the dielectric layer to the support layer in Comparative Example 1. Sm has relatively low resistance and probably serves as a conductive path. Since Sm in the dielectric layer is less in Comparative Example 1 than Example 1, it is found that the volume resistivity of the dielectric layer is probably partially increased in Comparative Example 1. Electric charges may be trapped by an area having an increased volume resistivity and prevented from passing through the dielectric layer. Since electric charges remain in the dielectric layer for some time, the attractive force is probably not eliminated immediately after the voltage application is stopped. In Comparative Example 1, mass transfer associated with the diffusion of Sm probably decreased the strength at the interface between the dielectric layer and the electrode.

Example 9

In the electrostatic chuck according to Example 1, a Mo heating resistor (heater) was embedded in the support layer. The evaluations described above were performed while the electrostatic chuck was maintained at 60° C. with the heating resistor. As a result, the attractive force was 4000 (Pa), the detachment time was 1 (s), the warping was 0.01 (mm), the strength after a heat cycle was 240 (Pa), the volume resistivity of the dielectric layer was $2\times10^{-10}$ ($\Omega$cm), the volume resistivity of the support layer was $2\times10^{-13}$ ($\Omega$cm), and the leakage-current was 130 ($\mu$A). Thus, the electrostatic chuck exhibited excellent performance. The leakage-current from the electrostatic electrode to the heating resistor was small. The electrostatic chuck could be heated without an abnormal current flowing to, for example, a heater power supply. Since a support layer of an electrostatic chuck according to the present invention has a high volume resistivity, a heating resistor can be directly embedded in the support layer and allows efficient contact conduction heating while a wafer is adsorbed on the electrostatic chuck.

The present application claims priority from the U.S. Application No. 61/167,265 filed on Apr. 7, 2009, the entire contents of which are incorporated herein by reference.

What is claimed is:

1. A ceramic electrostatic chuck that includes an embedded electrode, the electrostatic chuck comprising:
    a dielectric layer on which a wafer can be placed, the dielectric layer being formed of sintered aluminum nitride containing Sm and having a volume resistivity in the range of $4\times10^9$ to $4\times10^{10}$ $\Omega$cm at room temperature; and
    a support layer that is in contact with the back side of the dielectric layer, is formed of sintered aluminum nitride containing Sm and Ce, and has a volume resistivity of $1\times10^{13}$ $\Omega$cm or more at room temperature,
    wherein the dielectric layer is formed of sintered aluminum nitride that contains an Al—Sm—O compound. Sm being contained in an amount 1.2% to 4% by weight in terms of $Sm_2O_3$, the $Al_2O_3/Sm_2O_3$ equivalent weight ration of Al in terms of $Al_2O_3$ to Sm in terms of $Sm_2O_3$ being in the range of 0.8 to 1.5,
    wherein the support layer is harmed of sintered aluminum nitride that contains oxides of Sm and Ce, Sm being contained in an amount 0.96% to 2.2% by weight in terms of $Sm_2O_3$ Ce being contained in an amount 0.2% to 0.5% by weight in terms of $CeO_2$, and
    wherein Ce is contained only in the support layer.

2. The electrostatic chuck according to claim 1, wherein the electrode is formed of molybdenum metal or a molybdenum alloy and is disposed within the dielectric layer, within the support layer, or at an interface between the dielectric layer and the support layer.

3. The electrostatic chuck according to claim 1, wherein the support layer includes a heating resistor.

* * * * *